US005517039A

United States Patent [19]
Holonyak, Jr. et al.

[11] Patent Number: 5,517,039
[45] Date of Patent: May 14, 1996

[54] SEMICONDUCTOR DEVICES FABRICATED WITH PASSIVATED HIGH ALUMINUM-CONTENT III-V MATERIAL

[75] Inventors: Nick Holonyak, Jr., Urbana; Tim A. Richard, Batavia, both of Ill.; Mark R. Keever, Sunnyvale, Calif.; Fred A. Kish, San Jose, Calif.; Chun Lei, Sunnyvale, Calif.; Serge Rudaz, Sunnyvale, Calif.

[73] Assignee: Hewlett-Packard Company, Palo Alto, Calif.

[21] Appl. No.: 339,034

[22] Filed: Nov. 14, 1994

[51] Int. Cl.$^6$ ................................. H01L 33/00
[52] U.S. Cl. .................... 257/94; 257/95; 257/96; 257/97; 257/98; 257/631; 372/45; 372/46; 372/49
[58] Field of Search .................. 257/94, 95, 96, 257/97, 98, 631; 372/49, 45, 46

[56] References Cited

U.S. PATENT DOCUMENTS

| | | | |
|---|---|---|---|
| 4,227,975 | 10/1980 | Hartman et al. | 257/647 X |
| 4,656,638 | 4/1987 | Tihanyi et al. | 372/49 |
| 4,852,112 | 7/1989 | Kagawa et al. | 372/49 |
| 5,353,295 | 10/1994 | Holonyak, Jr. et al. | 372/46 X |
| 5,373,522 | 12/1994 | Holonyak, Jr. et al. | 372/45 |
| 5,400,354 | 3/1995 | Ludowise et al. | 372/45 X |
| 5,425,043 | 6/1995 | Holonyak, Jr. et al. | 372/50 |

FOREIGN PATENT DOCUMENTS

| | | | |
|---|---|---|---|
| 55-103778 | 8/1980 | Japan | 257/94 |
| 58-54691 | 3/1983 | Japan | 372/49 |

OTHER PUBLICATIONS

"Native-oxide Stripe-geometry Al x Ga 1-x As-GaAs Quantum Well Heterostructure Lasers." Article by J. M. Dallesasse and N. Holonyak, Jr. pp. 394-396 of American Institute of Physics, Jan. 28, 1991.
"Native Oxide Stabilization of AlAs-GaAs Heterostructures." Article by A. R. Sugg; N. Holonyak, Jr.; J. E. Baker; F. A. Kish and J. M. Dallesasse. pp. 1199-1201 of American Institute of Physics, Mar. 18, 1991.
"Native-oxide Stripe-geometry In 0.5 (Al x Ga 1-x) 0.5 P-In 0.5 Ga 0.5 P Heterostructure Laser Diodes." Article by F. A. Kish; s. J. Caracci; N. Holonyak, Jr.; J. M. Dallesasse; and A. R. Sugg; R. M. Fletcher; C. P. Kuo; T. D. Osentowski and M. G. Craford. pp.354-356 of American Institute of Physics, Jul. 15, 1991.
"Planar Native-oxide Buried-mesa Al x Ga 1-x As-in 0.5 (Al y Ga 1-y) 0.5 P-In 0.5 (Al z Ga 1-z) 0.5 P Visible-spectrum Laser Diodes." Article by F. A. Kish; S. J. Caracci; S. A. Maranowski; N. Holonyak, Jr.; K. C. Hsieh; C. P. Kuo; R. M. Fletcher; T. D. Osentowski and M. G. Craford. pp. 2521-2525 of American Institute of Physics, Mar. 15, 1992.
"Properties And Use Of In 0.5 (Al x Ga 1-x) 0.5 P and Al x Ga 1-x As Native Oxides In Heterostructure Lasers." Article by F. A. Kish, et al. pp. 1133-1139 of Journal of Electronic Materials, vol. 21, No. 12, 1992.
"Postfabrication Native-oxide Improvement Of The Reliability Of Visible-spectrum AlGaAs-In(AlGa)P p-n Heterostructure Diodes." Article by T. A. Richard; N. Holonyak, Jr.; F. A. Kish; M. R. Keever and C. Lei. pp. 2972-2974 of American Institute of Physics, May 29, 1995.
"Hydrolyzation Oxidation Of Al x Ga 1-x As-AlAs-GaAs Quantum Well Heterostructures And Superlattices." Article by J. M. Dallesasse; N. Holonyak, Jr.; A. R. Sugg; T. A. Richard and N. El-Zein. pp. 2844-2846 of American Institute of Physics, Dec. 24, 1990.
Ladany et al., "$Al_2O_3$ Half-Wave Films for Long-Life CW Lasers," *Applied Physics Letters*, vol. 30, No. 2, 15 Jan., 1977, pp. 87-88.

*Primary Examiner*—William Mintel
*Attorney, Agent, or Firm*—Jonathan B. Penn

[57] ABSTRACT

LEDs and other semiconductor devices fabricated with III-V materials and having exposed Al-bearing surfaces passivated with native oxides are disclosed. A known high temperature water vapor oxidation process is used to passivate the exposed layers of Al-bearing III-V semiconductor materials in confined-emission spot LEDs and other light emitting devices. These devices exhibit greatly improved wet, high temperature operating life, with little to no degradation in light output when exposed to such conditions.

20 Claims, 9 Drawing Sheets

SEMICONDUCTOR DEVICES FABRICATED WITH PASSIVATED HIGH ALUMINUM-CONTENT III-V MATERIAL

BACKGROUND OF THE INVENTION

This invention is in the field of semiconductor devices and their fabrication and particularly relates to semiconductor devices fabricated with high Al-content III-V semiconductor materials.

The performance of semiconductor devices fabricated using high Al-content III-V semiconductor materials frequently degrades with time when operating in wet, high temperature environments. Some of this degradation may be due to the effects of high temperature on the semiconductor devices. The performance losses caused primarily by high temperature are not the focus of this description.

A large percentage of the degradation experienced by high Al-content III-V semiconductor materials in wet, high temperature environments is due to the formation of undesirable oxides of Al, primarily Al[OH]$_3$ or a solid solution containing Al[OH]$_3$ and other column III oxides. In the remainder of this description, all references to Al-hydroxide, Al-oxide hydroxide, Al oxide, and mixtures thereof include the possible presence of other column III elements formed from an alloy of these elements and Al.

Oxides which contain Al[OH]$_3$ as a major constituent have several pernicious traits. They are opaque and block the transmission of light from the semiconductor device. They also tend to attack the crystal structure of the device. The formation of Al[OH]$_3$ is particularly encouraged in those devices and in the portions of devices where photon flux is high, in a process called photon assisted hydrolization. In devices which do not produce light, the degradation process is similarly encouraged by carrier recombination, phonon generation, or any other energy generating process.

Preventing the formation of Al[OH]$_3$ in high Al-content III-V semiconductor materials is necessary to insure long operating lifetimes with acceptable performance in wet, high temperature environments. Several techniques are presently employed to minimize the degradation of high Al-content material. These include minimizing the thickness of the high Al-content layers and/or capping the material with lower Al-content material. The addition of In tends to stabilize high Al-content semiconductors against hydrolization degradation. The addition of In to the layer in question or capping the layer with In-bearing material may be beneficial. However, in some instances, it is not feasible, practical, convenient or cost efficient to utilize these techniques.

One other known method for preventing the formation of Al[OH]$_3$ is the formation of desirable oxides of Al over the high Al-content III-V materials to protect the materials from exposure to moisture and the resultant formation of Al[OH]$_3$. These oxides, herein called native oxides, are typically formed at higher temperatures and include Al(O)OH and Al$_2$O$_3$. If these native oxides successfully prevent the formation of undesirable oxides such as Al[OH]$_3$ when the materials or devices using the materials operate in wet, high temperature environments, the materials and/or devices are considered to be passivated.

Within this description, a successfully passivated device is one that has survived a wet, high-temperature operating life ("WHTOL") test under active operation without significant device degradation for 1,000 hours. For example, if a light emitting diode ("LED") undergoes a WHTOL test with less than a 20% reduction in emitted light, exclusive of the degradation caused solely by the elevated temperatures, it is passivated for purposes of this invention. Herein, the conditions of a WHTOL test are under active operation (e.g. forward bias in an LED) in an atmosphere of 85% relative humidity and a temperature of 85° C. Although these conditions are extreme, they provide a good indication of how devices will perform in hot and high humidity conditions.

Although many methods for forming native oxides from an Al-bearing group III-V semiconductor materials are known, one in particular forms a high quality oxide. This method is described in U.S. Pat. No. 5,262,360, issued on Nov. 16, 1993 to Holonyak, Jr. et al., entitled "AlGaAs Native Oxide" ("Holonyak") and is applicable herein. Holonyak describes the use of a water-vapor environment at elevated temperatures to form the native oxide. The Holonyak process produces a strong and durable native oxide.

Forming a native oxide on an Al-bearing semiconductor layer in a device is not necessarily sufficient to passivate the device. Many process and material variables must be properly controlled to use the Holonyak process to passivate LEDs and other semiconductor devices successfully.

SUMMARY OF THE INVENTION

The present invention, in its first embodiment, comprises a general method for using the Holonyak process to passivate high Al-content III-V materials and the devices incorporating these materials. The method includes controlling the temperature and time of the oxide growth period to insure that the resultant native oxide layer is within a particular thickness range. It also comprises optimizing the structure of the semiconductor device being passivated so that the native oxide layers can be grown to the proper thickness with the desired level of uniformity in the proper portion of the device. Growing a native oxide layer of the proper thickness and uniformity over areas of high photon flux, high carrier recombination, or other energy generating processes is a particular aim of the present invention. To that end, parameters of the device itself, such as Al mole fraction, doping type and level, and stress levels are arranged to encourage native oxide growth over the desired areas of the desired uniformity and thickness.

A particular embodiment of the present invention is a method for using the Holonyak process to passivate confined-emission spot LEDs. Confined-emission spot LED wafers may be oxidized with mesas etched between the individual LEDs so that the entire exposed Al$_x$Ga$_{1-x}$As window surface, including its edges, are oxidized. The optimal thickness of the Al-bearing native oxide is 0.1 to 7 μm. Confined-emission spot LEDs passivated in this manner show little or no light output change after 2,500 hours of WHTOL tests whereas devices not passivated in the confined light emission area exhibit degradation to less than 50% of their original light output in 1,500 hours.

In other embodiments of the present invention, other LED structures and devices using III-V materials and having exposed Al-bearing layers such as lasers, modulators, any device which uses a Bragg reflector, photodetectors, waveguides, and transistors are passivated. This list is not intended to be comprehensive.

These embodiments and others will now be described in detail with reference to the figures listed and described below.

DETAILED DESCRIPTION OF THE PREFERRED EMBODIMENTS

The present invention begins with the Holonyak process. Using a temperature range between 375° C. and 550° C. for a period of time of up to three hours, native oxides are grown on high Al-content III-V materials. The most preferable temperature range is between 450° C. and 550° C. and the most preferable time period is from 0.25 hours to two hours. In most cases the native oxide is grown on wafers, not on individual devices. However, nothing herein should be taken to preclude the growth of native oxide on individual devices to create a passivated device. The desired final thickness of the native oxide is between 0.1 micrometers to 7 micrometers.

In light emitting semiconductor devices, the native oxides is grown particularly over those areas where photon flux is high as these areas are most susceptible to photon assisted hydrolization. In those semiconductor devices which do not emit light but still possess exposed high Al-content areas that require passivation, the native oxide should be grown over those portions of the device where carrier recombination flux, phonon generation, or other energy transmitting processes occur as they also assist growth of undesirable forms of oxides of Al.

Figure 1:
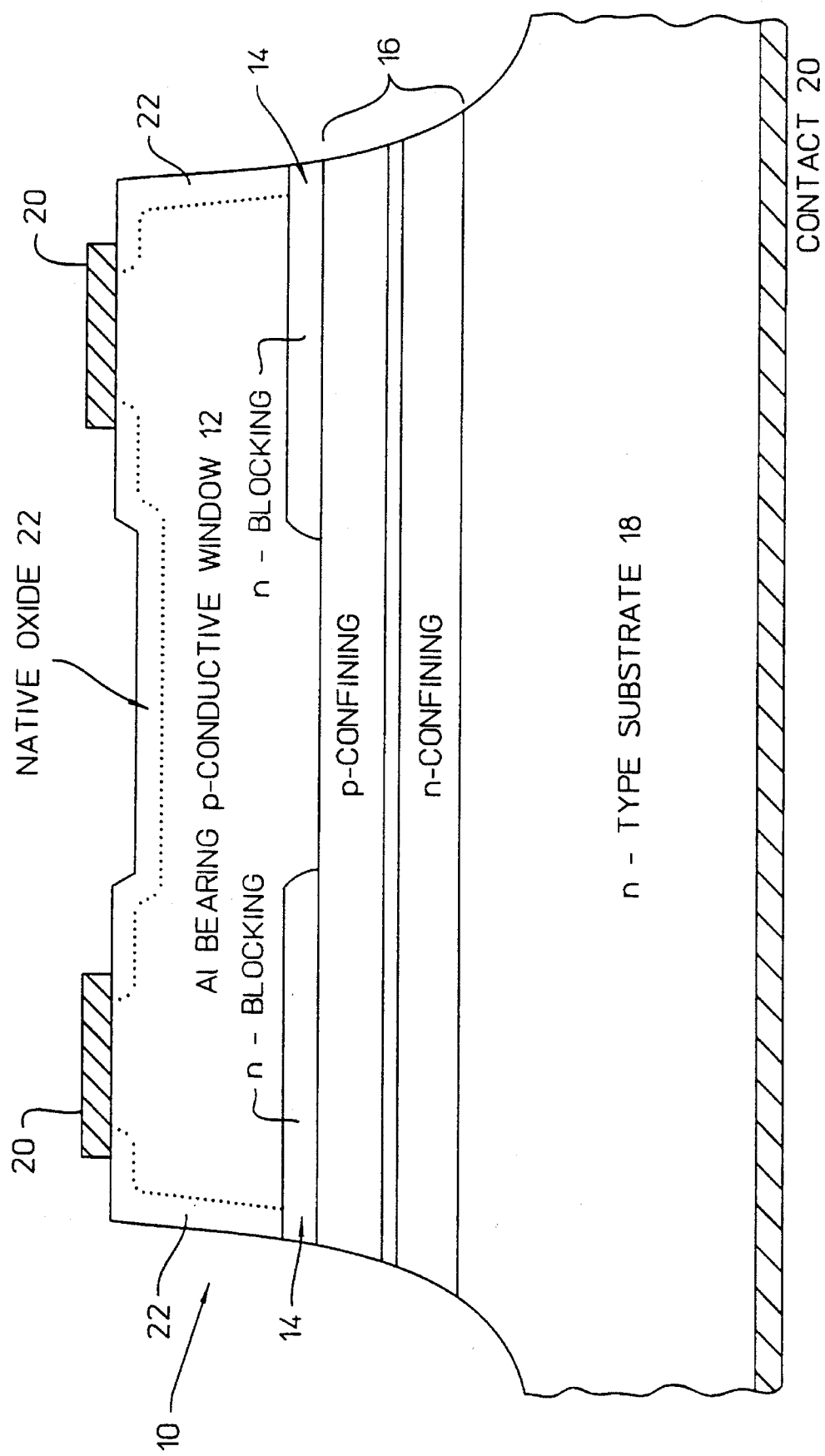
FIG. 1 illustrates a passivated confined emission spot emission LED.

The first specie of device passivated using the teachings of the present invention is shown in FIG. 1 and comprises a confined-emission spot LED using $Al_xGa_{1-x}As$ only in the top light emitting window. LED 10 is comprised of a p-type $Al_xGa_{1-x}As$ current spreading window 12, where X is approximately 0.5 to 0.7, window 12 being approximately 5 to 20 μm thick, n-type current blocking layers 14, a p-n $In_{0.5}(Al_yGa_{1-y})_{0.5}P$ double heterostructure active region 16, an n-type GaAs substrate 18 and contact metallizations 20.

In known confined-emission spot LEDs with Al-bearing windows, WHTOL degradation occurs primarily in the light emission spot on the top of the LED, presumably due to photon assisted hydrolization.

In the confined-emission spot LED of FIG. 1, little to no light is emitted from the sides of the LED. Even where some light is emitted from the edges of the LED, the total photon flux through the sides of the device is low compared with the flux through the top light emission spot. It is consequently not as critical to passivate the sides of the LED, as the photon-assisted degradation process does not greatly affect them. Therefore, these devices generally only require passivation in the top light emitting spot where photon assisted hydrolization is most severe. However, by oxidizing confined-emission spot LED wafers after mesas are etched between the devices, the entire exposed $Al_xGa_{1-x}As$ window surface, including the edges, is converted to native oxide. This has the added benefit of further encapsulating the LED and reducing electrical leakage at the exposed p-n junction on the edge of the LED, but does not further reduce light output degradation.

This oxidation step uses the Holonyak process with a specific combination of temperatures between 450°–550° C. and oxidation times varying from 0.25 to 3 hours to produce a native oxide layer between 0.1 and 7.0 micrometers thick. In this particular embodiment, the passivating process used a temperature of 500° C. for one hour. The resulting Al-bearing native oxides extend over the rough top surface and edges of the $Al_xGa_{1-x}As$ window layer. After oxidation, individual chips were formed by scribing and breaking. Other techniques to separate the individual LED chips could be used. The native oxide layers are shown as layers 22 in FIG. 1. The individual chips were die-attached on lead frames and encapsulated in injection molded plastic packages. The oxidation process did not affect light output significantly and increased the forward voltage of the LED very slightly as compared with unoxidized devices (<0.1V@60 mA).

Figure 2:
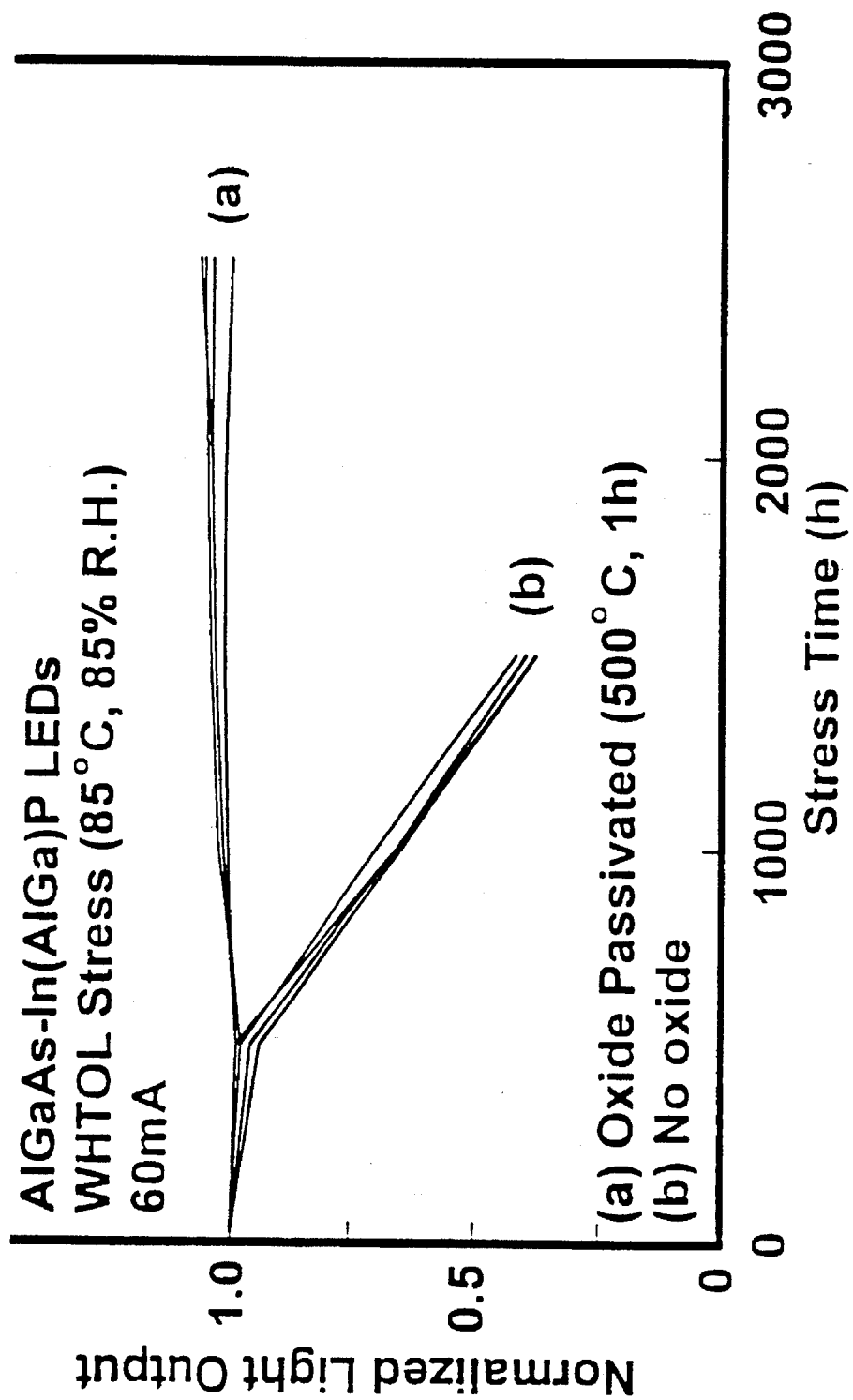
FIG. 2 is a graph showing the WHTOL performance of the passivated LED shown in FIG. 1 compared to confined emission spot LEDs without passivation.

The packaged confined-emission spot LEDs were forward biased with a 60 mA current and subjected to a WHTOL test. FIG. 2 is a graph of time versus normalized light output for (a) devices passivated by the Holonyak method for 1 hour at 500° C. and (b)unoxidized controls. The oxidized LEDs showed little to no output change after 2,500 hours of testing and were therefore considered successfully passivated, whereas the light output of the control LEDs decreased by about 55% in 1,500 hours.

Figure 3:
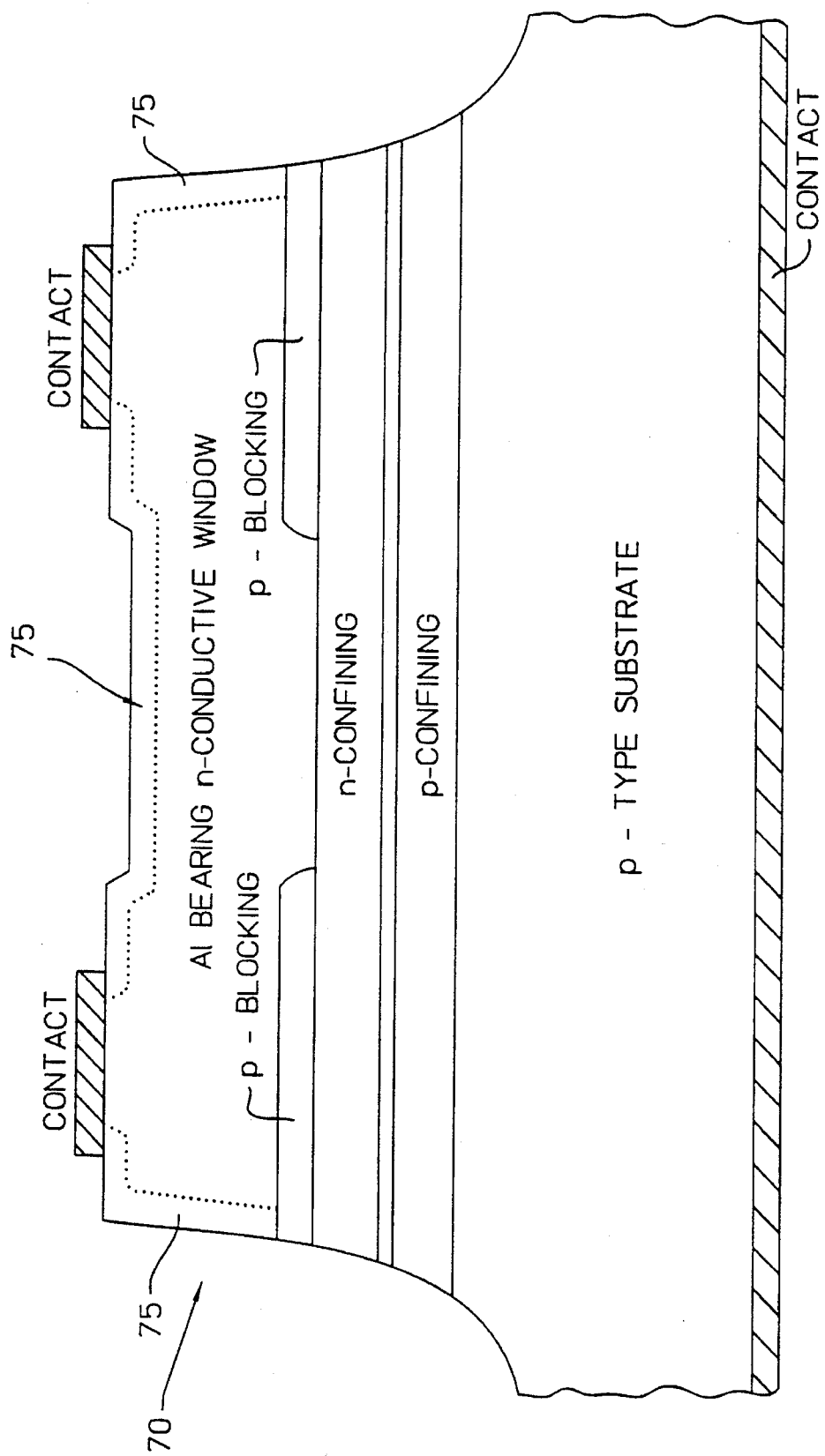
FIG. 3 illustrates another embodiment of the present invention.

In a similar fashion, the n-type Al-bearing semiconductor surface of confined-emission spot LED 70, shown in FIG. 3, can be passivated by native oxide layers 75, respectively. The LED in FIG. 3 is similar to the LED shown in FIG. 1, with the p- and n-type conductivity layers interchanged.

Figure 4:
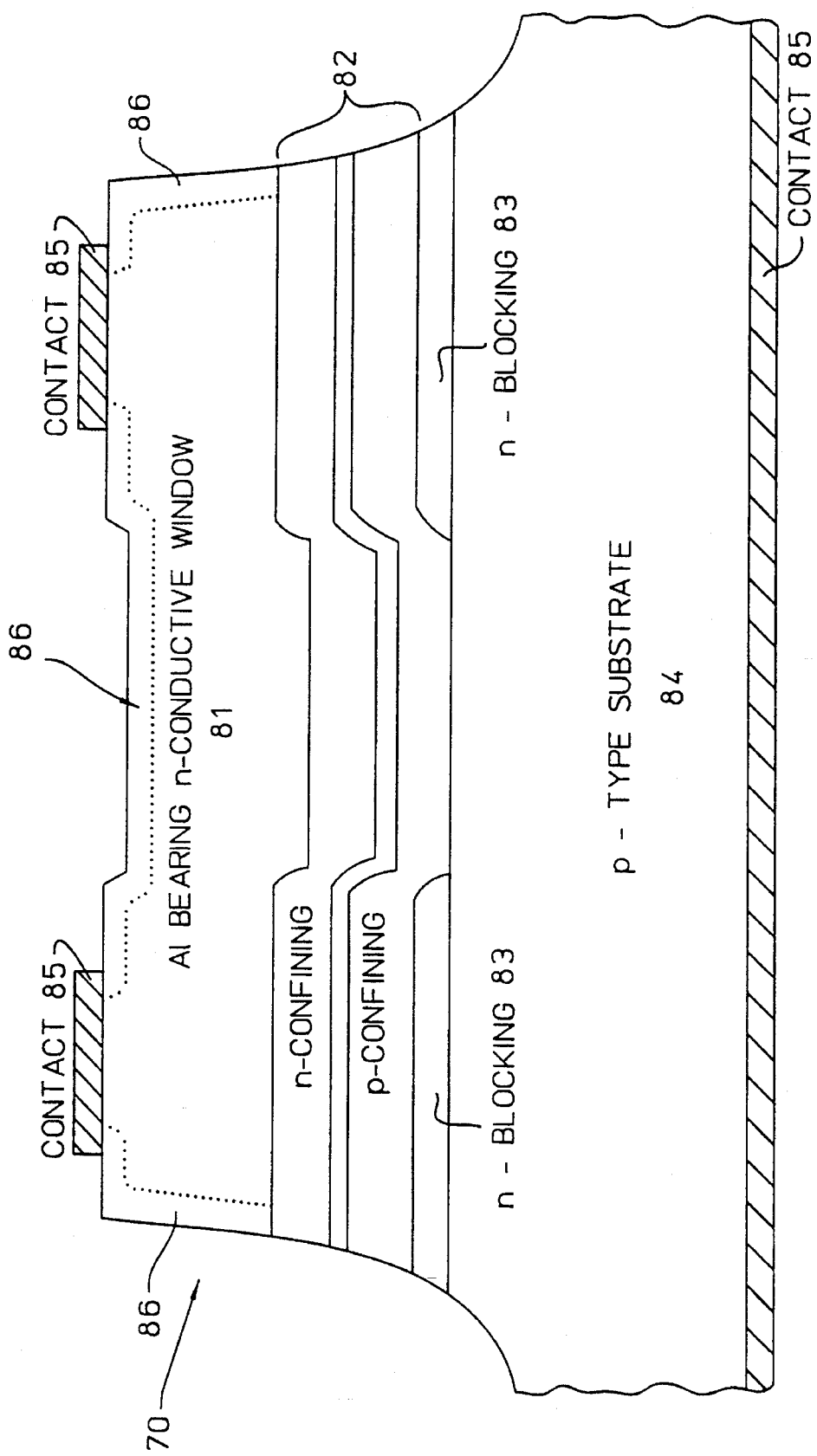
FIG. 4 illustrates another embodiment of the present invention.

FIG. 4 illustrates another native oxide passivated confined-emission spot LED. In FIG. 4, LED 80 has an n-type Al-bearing current spreading window 81, an n-p double heterostructure active region 82, n-type current blocking layers 83, a p-type GaAs substrate 84 and contact metallizations 85. Native oxide layer 86 passivates LED 80.

Al-bearing native oxide films of 0.1 μm thickness can be grown without pinholes or cracks to passivate smooth $Al_xGa_{1-x}As$ surfaces. Thicker native oxide films are required to passivate surfaces with rough morphology or with etched steps such as those possessed by the LED illustrated in FIGS. 1, 3, and 4. Native oxide films thicker than 7 μm are prone to cracks presumably caused by internal stress. Such cracks prevent complete passivation and result in light output loss during WHTOL tests, making thick native oxides undesirable in this application.

Figure 5:
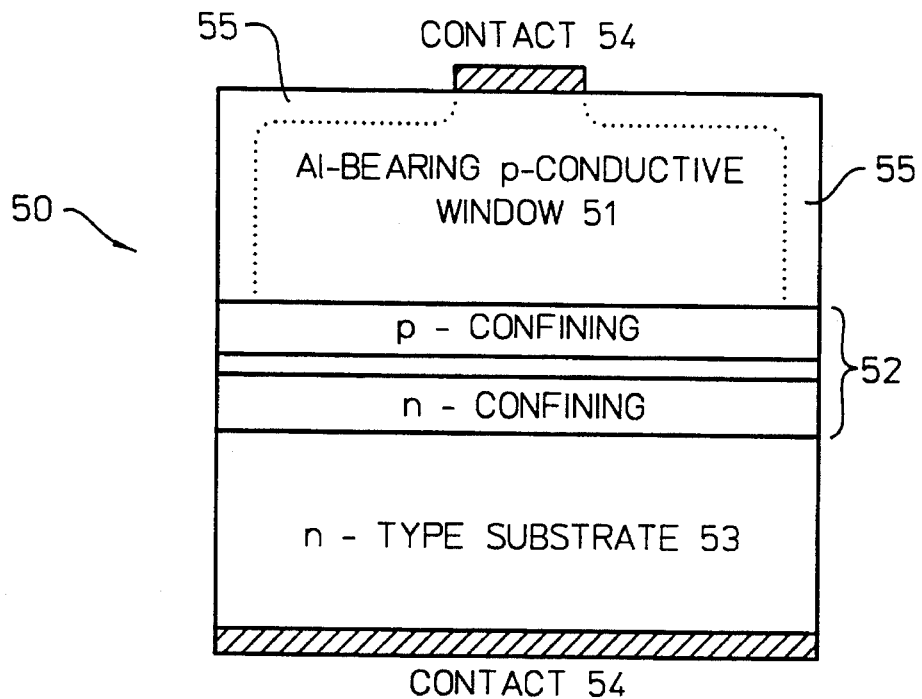
FIG. 5 illustrates yet another embodiment of the present invention.
Figure 6:
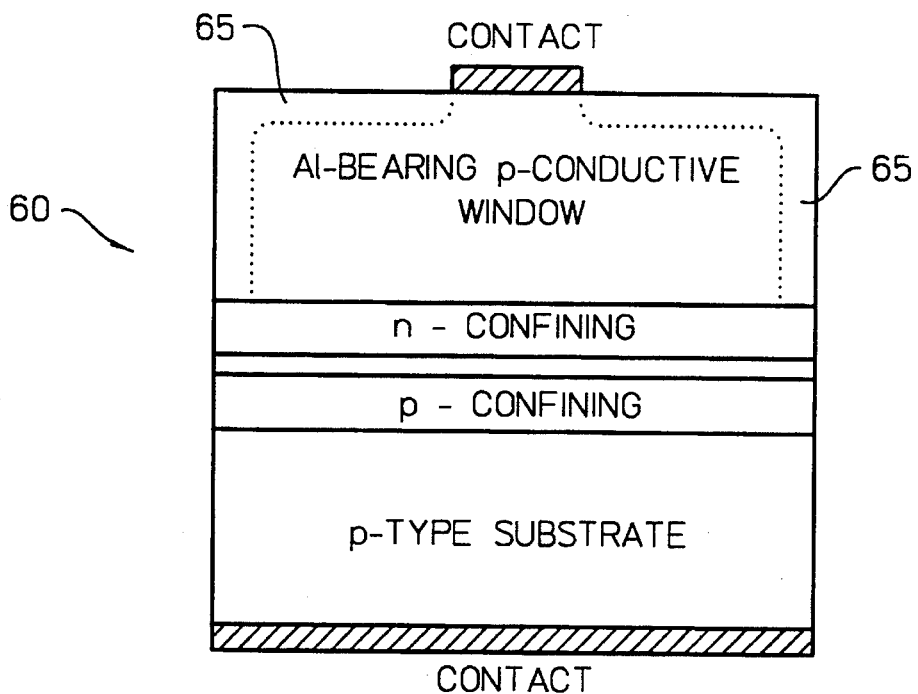
FIG. 6 illustrates still another embodiment of the present invention.

The Holonyak process can also be used to passivate LEDs in which an appreciable photon flux is emitted through surfaces other than the top (e.g.,sides) of the LEDs. In this case, the surface areas of the LEDs which emit most of the light must be passivated. As an example, the passivated planar LED shown in FIG. 5 emits considerable photon flux through the side edges of the LED and so the majority of the edges should be passivated. Planar LED 50 comprises a p-type $Al_xGa_{1-x}As$ or other Al-bearing III-V semiconductor current spreading window 51, a p-n double heterostructure active region 52, an n-type GaAs substrate 53 and contact metallizations 54. Native oxide areas 55 are grown in window 51 to passivate LED 50. Note that although the active region 52 can contain a high amount of Al, it may not be important to passivate the edges of this region since the relative area of photon flux is low. The n-type Al-bearing semiconductor surface of planar LED 60 shown in FIG. 6 can be passivated by native oxide layer 65. This LED is similar to the LED in FIG. 5 with the p- and n-type conductivity layers interchanged.

Figure 7:
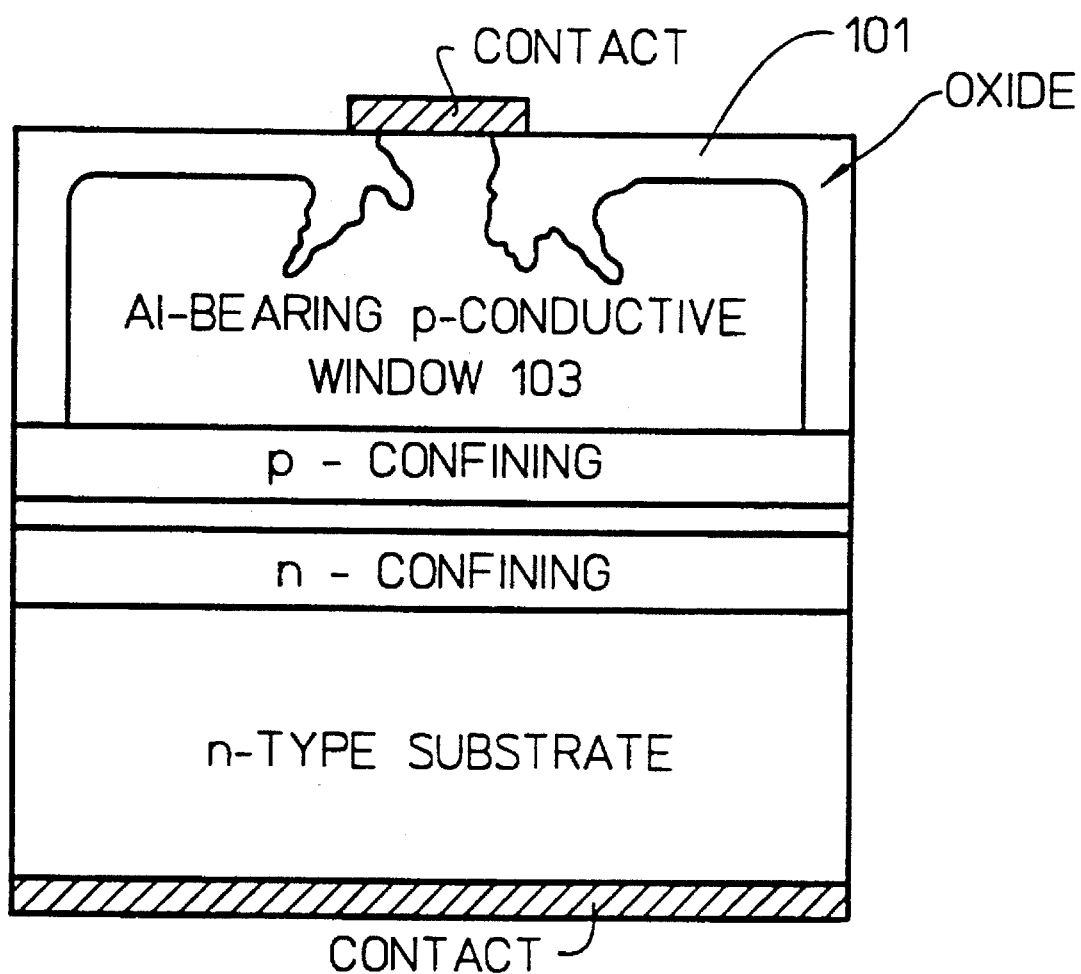
FIG. 7 shows a planar LED with anisotropic native oxide growth.

Tailoring the devices themselves to encourage oxide growth of the requisite thickness and uniformity in the requisite regions is a particular teaching of the present invention. Minimizing tensile and compressive stress between layers of dissimilar materials can prevent the growth of anisotropic native oxide "spikes" which exceed the desired thickness and uniformity. FIG. 7 shows a planar LED structure similar to the one shown in FIG. 5 in which anisotropic growth of the native oxide has occurred at the perimeter of the thick top metal contact, resulting in spikes of native oxide 101 penetrating deep into the Al-bearing p-conductive window layer 103. The anisotropic growth results from the stress between the thick top contact metal and the underlying Al-bearing semiconductor layer caused by differences in thermal expansion during native oxide growth using the Holonyak process. These uncontrolled spikes vary in depth and density from device to device depending on such variables as metal pattern size, composition, and thickness, semiconductor morphology, and metal to semiconductor adhesion.

The stress-induced oxide spikes can cause significant changes in initial device performance by impeding uniform current flow in the conductive window layer. In the case of the planar LED device in FIG. 7, the result is an undesirable increase in forward voltage, a less uniform light emission profile and less total light output. The problem is pronounced in structures that rely on p-type conductive window layers to spread current laterally in the device as the conductivity of common Al-bearing p-type window materials (e.g. AlGaAs) is generally less than n-type materials of comparable composition and doping levels. The degree of oxide thickness uniformity required to avoid initial LED performance deviations is dependent on the combination of conductive layer parameters (e.g. conductivity and thickness) and such factors as desired lateral current spreading distance and uniformity. For example, LEDs such as those shown in FIGS. 1 and 5 with p-type window layers with conductivity of roughly $20(\Omega\text{-cm})^{-1}$ may exhibit significant changes in initial device performance when several anisotropic oxide spikes penetrate more than 25% into a window layer of 15–20 μm thickness which nominally spreads current ~100 μm laterally. In this instance, device and oxide growth conditions should be tailored so that anisotropic spikes deeper than ~5 μm are avoided. LED structures with different layer parameters or configurations will require the oxide growth uniformity to be controlled to a lesser or greater degree to avoid similar problems.

Significant reduction in device electrical or optical performance could also occur in other devices such as lasers, waveguides and transistors if the native oxide growth is not properly controlled. It is therefore important to tailor the device structure and oxide growth parameters to improve control of oxide thickness uniformity to minimize degradation in initial device performance.

Device design measures to better control oxide growth uniformity will also reduce device-to-device variations on a single wafer as well as increase reproduceability from lot to lot, improving overall production yields.

For the planar LED in FIG. 7, undesired anisotropy in oxide growth depth at the perimeter of the metal contact can be minimized by reducing stress between the metal and the underlying semiconductor. This may be achieved, for example, by using a multilayer metal contact wherein the thermal expansion characteristics of the individual metal layers are balanced so that the metal stress on the underlying semiconductor window layer is minimized at the chosen native oxide growth temperature.

The semiconductor layer structure can be tailored to limit the native oxide growth depth to a desired thickness. Varying the doping levels of the semiconductor materials is also used to control native oxide thickness, along with other known methods of tailoring the growth of native oxide including varying the mole fraction of Al in the semiconductor materials and using materials of different doping types. Tailoring the stress between the layers can also be used to create regions of thicker native oxide growth in close proximity to other regions of thinner native oxide growth.

Figure 8:
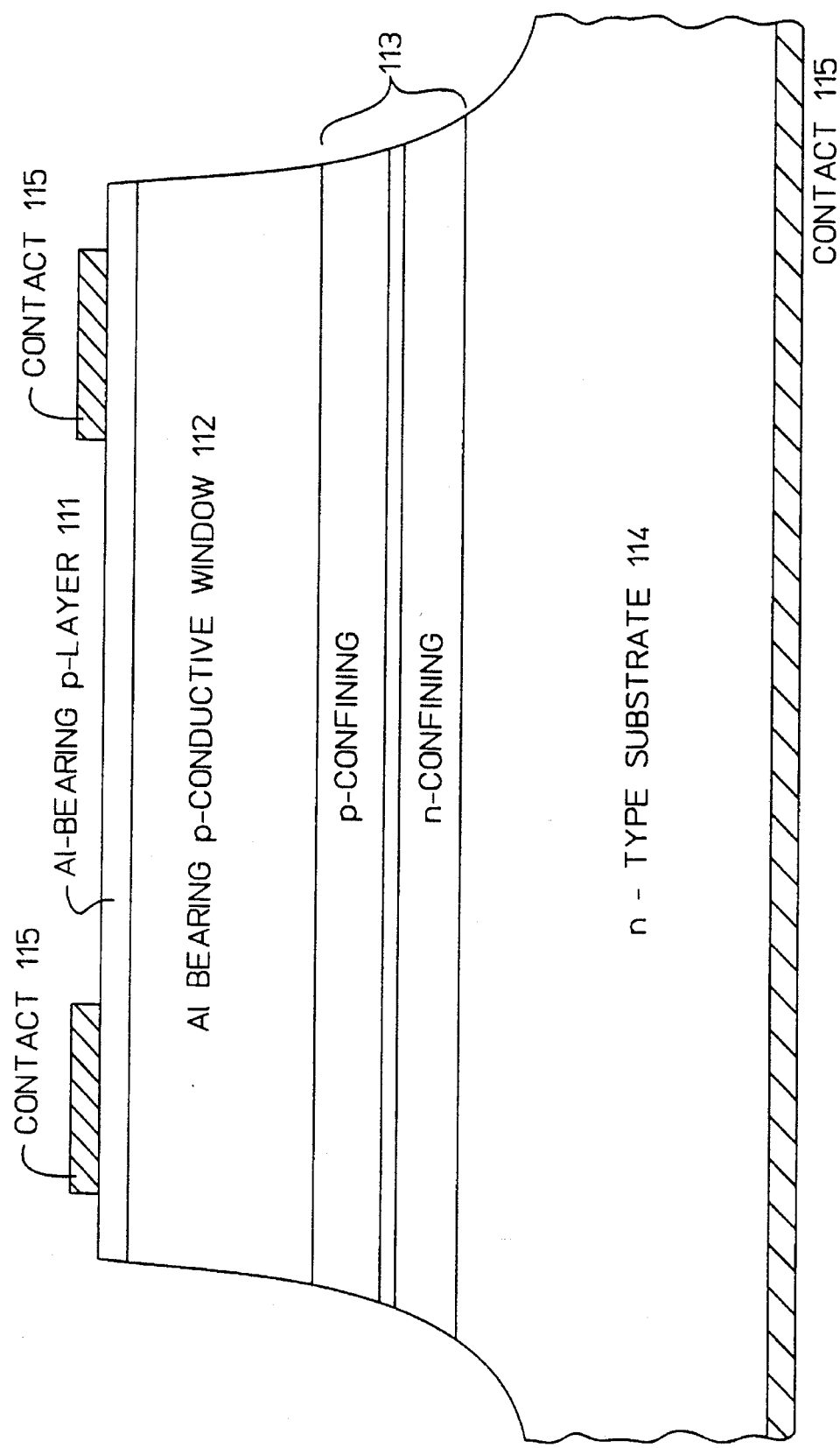
FIG. 8 shows an LED wherein anisotropic native oxide growth has been controlled.

By varying the doping type and/or level of the Al-bearing layers, the thickness of the native oxide layer, or the depth of the oxide's lateral penetration will vary from layer to layer for any given process variables. For example, if two adjacent layers of Al-bearing III-V material are doped respectively with p and n dopants, the same process steps will result in a thicker native oxide on the p-type material than on the n-type material. P+ material oxidizes faster than p-material and n- material oxidizes faster than n+material. The oxide growth rate also increases with higher Al mole fraction in the semiconductor. An example is shown in FIG. 8 wherein the Al mole fraction and/or p-doping level is higher in the first exposed Al-bearing layer 111 compared to the underlying layer 112. Proper selection of these parameters results in a significantly lower oxidation rate in layer 112, which reproducibly limits oxidation growth to the thickness defined by layer 111.

The oxide growth rate is strongly influenced by stress, with regions of high stress exhibiting enhanced oxidation rates. Stress can be incorporated in devices by lattice-mismatched growth in pseudomorphic or bulk layers or, in non-planar structures, by various forms of device processing. In the latter case, the stress and consequent enhanced growth rate may be local.

The passivating property of Al-bearing native oxides can be simultaneously combined with its insulating properties and its tendency for anisotropic oxidation to yield a still further improved form of confined-emission spot LED.

Figure 9:
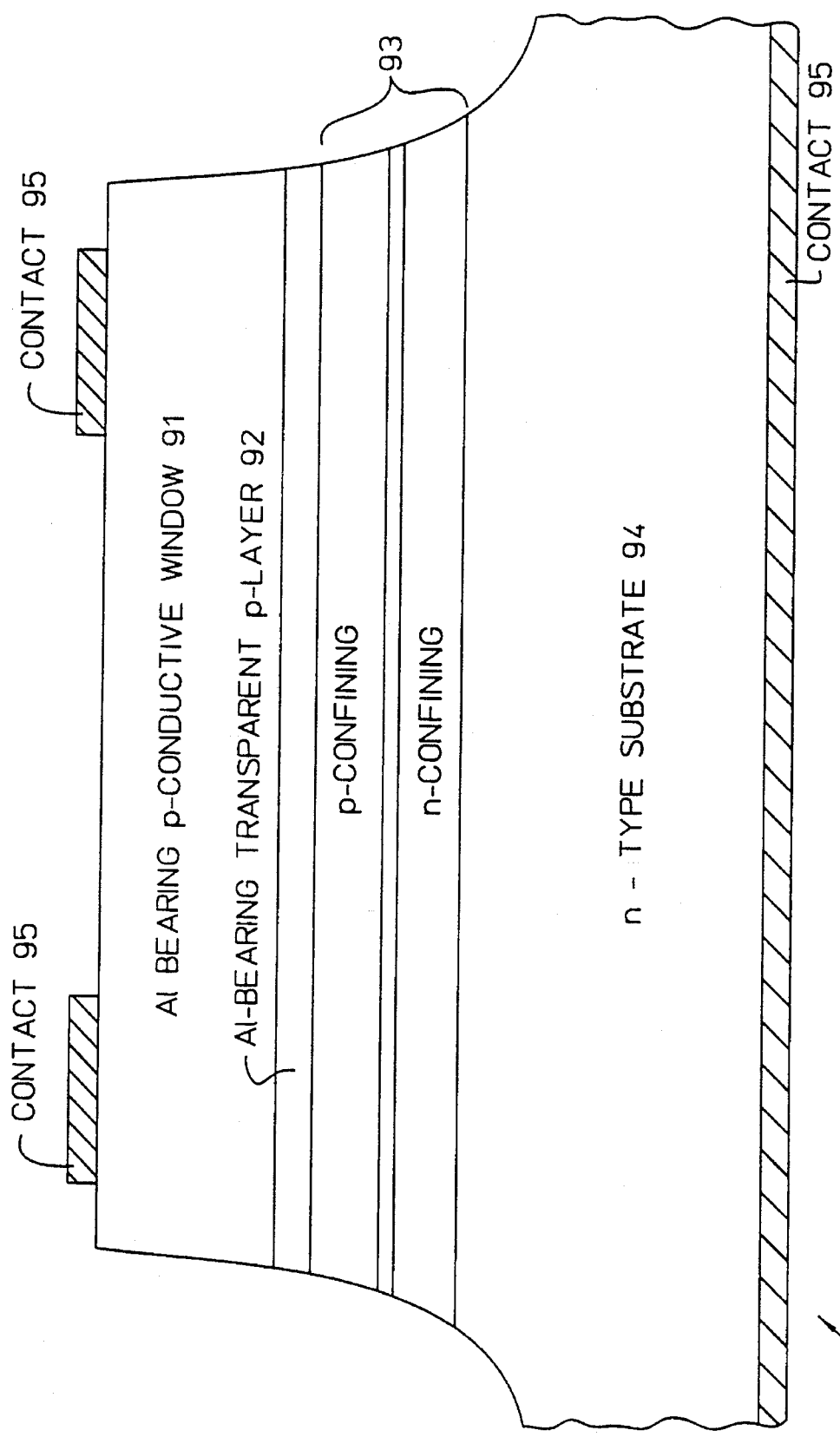
FIG. 9 shows an LED prior to passivation with specially designed lairs for anisotropic oxide growth.

In FIG. 9, LED 90 comprises an Al-bearing p-type conductive window 91, an Al-bearing transparent p-type layer 92, a p-n double heterostructure active region 93, an n-type substrate 94, and contact metallizations 95. The composition of layer 92 is chosen to have a higher Al-mole fraction so that the lateral oxidation rate of the Al-bearing material in layer 92 is much faster than the bulk oxidation rate of the Al-bearing p-type conductive window 91. Such anisotropy due to Al-mole fraction differences is known in $Al_yGa_{1-y}As/Al_xGa_{1-x}As$ layers.

Figure 10:
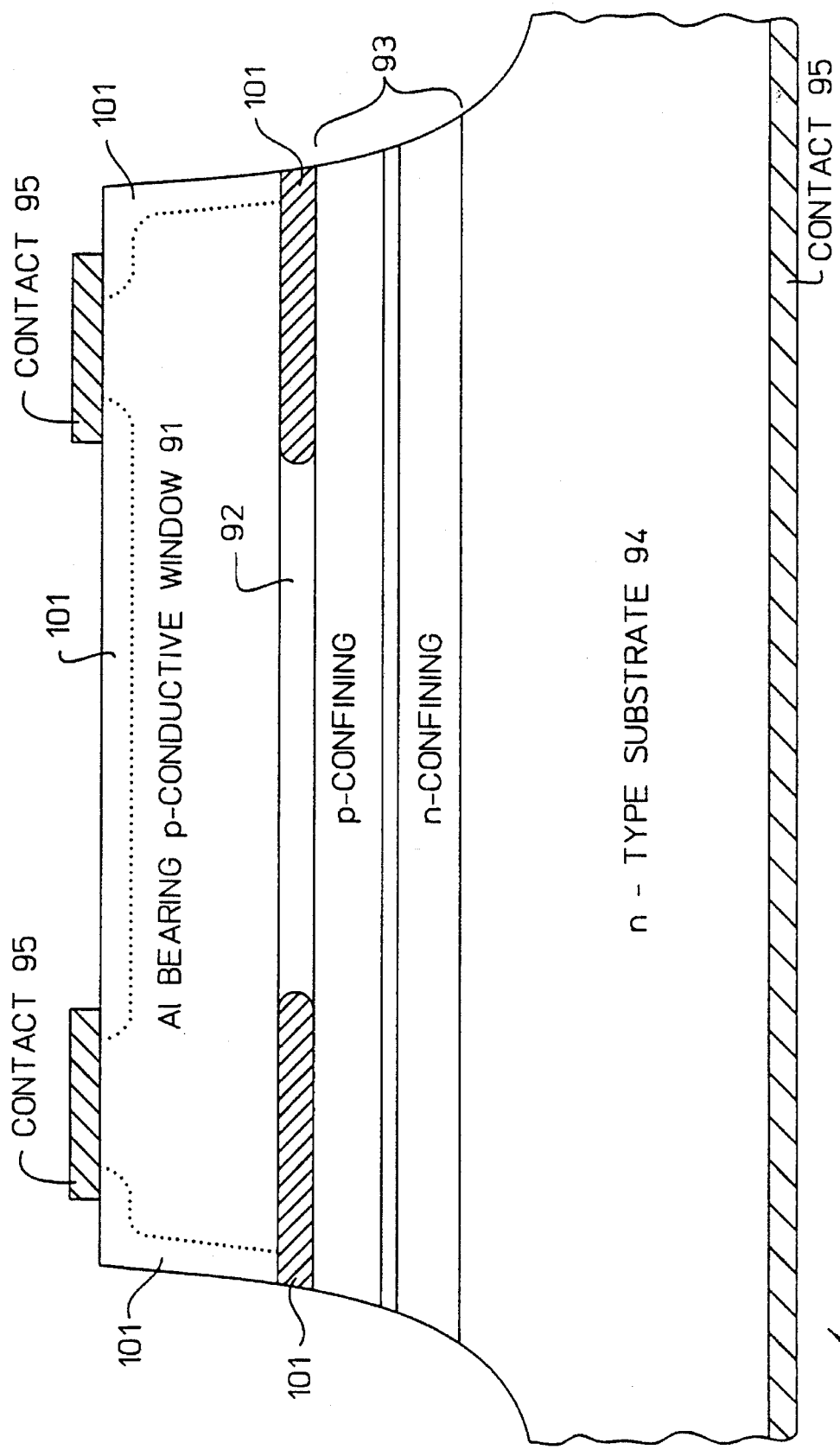
FIG. 10 shows the same LED as in FIG. 7 after passivation with additional current-blocking characteristics provided by anisotropic/oxidation.

Oxidation of LED 90, with its Al-bearing edges exposed, produces the LED shown in FIG. 10. LED 100 is identical to LED 90 with the exception of native oxide layers 101. The highly anisotropic oxidation of Al-bearing layer 92 results in the native oxide extending significantly (more than 50 microns) inward from the edges of LED 100. The insulating properties of native oxide layers 101 restrict current flow in those regions, thus producing a confined-emission spot LED. LED 100 only requires one epitaxial growth step, as compared with the LEDs illustrated in FIGS. 1 and 3 through 6, which required two. Any Al-bearing compounds could have been chosen for layers 91 and 92 (FIG. 9) as long as they are largely transparent and possess the proper anisotropy in their respective oxidation rates. Layer 92 may actually be a lamination of several layers, some of which may not contain Al, so that the device's reliability, as well as the oxidation anisotropy of the Al-bearing layers might be enhanced. At least one layer in a laminated stack would need to have the proper relative oxidation anisotropy. This technique of lateral oxidation has been employed in optoelectronic devices wherein the lateral oxide "spikes" extend from 10 to less than 50 μm inward from the edge. The disclosed device differs from these devices in that the oxide extends significantly further into the crystal(at least 50–500μm). It is not clear from the previous work that such a degree of anisotropy could be obtained and then also utilized in a functional device. Devices fabricated in a method similar to that described herein do possess these traits.

The substrates for the devices described herein may comprise any single semiconductor or a combination of semiconductor layers which do not contain Al. The same Al-bearing oxidation/passivation can be applied to such structures. If the substrate or other LED layers contain sufficient Al, such layers, if they are exposed and have high photon flux or energy generation, may also require passivation.

The teachings of the present invention can be applied to any semiconductor device having exposed surfaces containing Al-bearing III-V semiconductor materials. The devices which may benefit from the passivation techniques taught herein include lasers, any light emitting semiconductor having or using a Bragg reflector, waveguides, modulators, and transistors. This list is not intended to be comprehensive.

By controlling stress, doping levels and the Al mole fraction of the different Al-bearing III-V materials, the precise thickness or depth of the native oxide can be carefully controlled. This control over the rate of oxide formation in different layers of Al-bearing semiconductor materials facilitates precise reproducible manufacture of semiconductor devices passivated using the present invention. The size of the confined emission spot in the confined emission spot LED shown in FIGS. 9 and 10 is only one example of how the same process can be used to create a native oxide growth of different dimensions from one layer to the next, with the resulting ability to precisely control the operating properties of the device.

What is claimed is:

1. A passivated confined emission light emitting diode comprising:

a substrate comprised of a semiconductor material;

a P-N junction active region proximate to the substrate;

a current confinement layer proximate to the active region for restricting current flow through the active region;

an exposed Al-bearing semiconductor material layer forming a current spreading window over the current confinement layer and the active region; and a native oxide layer formed on the exposed Al-bearing semiconductor material layer, the native oxide layer having a thickness of at least 0.1 micrometers and less than 7.0 micrometers, the native oxide layer passivating the light emitting diode by covering the exposed Al-bearing semiconductor material layer in those areas wherethrough a majority of the light generated by the diode is transmitted.

2. The passivated confined emission light emitting diode of claim 1 wherein the native oxide layer is thicker where formed on an exposed Al-bearing semiconductor material layer having a first level of stress in its crystal structure than where formed on a second, exposed Al-bearing semiconductor material layer having a second, lower level of stress in its crystal structure.

3. The passivated confined emission light emitting diode of claim 1 wherein the thickness of the native oxide layer is determined by a predetermined stress level between a metal contact layer and the current spreading window, the metal contact layer formed on the current spreading window.

4. The passivated confined emission light emitting diode of claim 1 wherein the thickness of the native oxide layer is determined by the Al mole fraction in the exposed Al-bearing semiconductor material layer.

5. The passivated confined emission light emitting diode of claim 1 wherein the thickness of the native oxide layer is determined by the doping concentration in the exposed Al-bearing semiconductor material layer.

6. The passivated confined emission light emitting diode of claim 1 wherein the thickness of the native oxide layer is determined by the doping type in the exposed Al-bearing semiconductor material layer.

7. A semiconductor light emitting diode comprising:

a substrate region;

a P-N junction active region proximate to the substrate region;

at least a first current spreading window layer proximate to the P-N junction active region;

at least a first exposed Al-bearing III-V semiconductor layer; and at least a first native oxide region overlying the exposed Al-bearing III-V semiconductor layer and at least 0.1 micrometers thick and no more than 7.0 micrometers thick, the native oxide region passivating the semiconductor light emitting diode by covering the exposed Al-bearing III-V semiconductor layer in those areas wherethrough a majority of the photon flux generated by the semiconductor light emitting diode is transmitted.

8. The semiconductor light emitting diode of claim 7 wherein the at least first exposed Al-bearing III-V semiconductor layer further comprises a plurality of exposed Al-bearing III-V semiconductor layers wherein the exposed Al-bearing III-V semiconductor layers each have different doping levels and types, the at least a first native oxide region further comprising a plurality of native oxide regions overlying the plurality of exposed Al-bearing III-V semiconductor layers, the native oxide regions varying in thickness as the doping levels change from p+ to p– and n– doping levels to n+ doping levels.

9. The semiconductor light emitting diode of claim 7 further comprising a plurality of exposed Al-bearing III-V semiconductor layers wherein the Al-bearing III-V semiconductor layers each have a predetermined level of stress, the native oxide regions varying in thickness in proportion to the predetermined stress level in the plurality of exposed Al-bearing III-V semiconductor layers.

10. The semiconductor light emitting diode of claim 7 further comprising a plurality of exposed Al-bearing III-V semiconductor layers wherein the Al-bearing III-V semiconductor layers have predetermined mole fractions of Al, the native oxide regions varying in thickness in proportion to the mole fraction of Al in the Al-bearing III-V semiconductor layers.

11. The semiconductor light emitting diode of claim 7 further comprising a plurality of exposed Al-bearing III-V semiconductor layers wherein the exposed Al-bearing III-V semiconductor layers have different doping types, the native oxide region varying in thickness in relation to the doping types of the exposed Al-bearing III-V semiconductor layers.

12. The semiconductor light emitting diode of claim 7 wherein the current spreading window and the first exposed Al-bearing III-V semiconductor layer comprise the same layer.

13. The semiconductor light emitting diode of claim 7 wherein the substrate comprises an Al-bearing semiconductor material.

14. The semiconductor light emitting diode of claim 7 wherein the current spreading window layer comprises an Al-bearing semiconductor material.

15. A confined emission light emitting diode comprising:

a semiconductor substrate;

an active region proximate to the substrate;

an Al-bearing layer proximate to the active region;

a conductive window proximate to the Al-bearing layer; and native oxide spikes, the native oxide spikes extending laterally from at least 50 microns up to 500 microns into the Al-bearing layer, the native oxide spikes limiting current flow through the active region.

16. The confined emission light emitting diode of claim 15 wherein the lateral length of the native oxide spikes is determined by the Al mole fraction in the Al-bearing layer.

17. The confined emission light emitting diode of claim 15 wherein the lateral length of the native oxide spikes is determined by the levels of compressive and tensile stress within the crystal structure of the Al-bearing layer.

18. The confined emission light emitting diode of claim 15 wherein the lateral length of the native oxide spikes is determined by the doping level and doping type of the Al-bearing layer.

19. The confined emission light emitting diode of claim 15 wherein the conductive window comprises an Al-bearing semiconductor material, a native oxide layer being formed on the conductive window simultaneously with the native oxide spikes.

20. The confined emission light emitting diode of claim 15 wherein the Al-bearing layer is substantially transparent to wavelengths of light generated by the light emitting diode.

* * * * *

UNITED STATES PATENT AND TRADEMARK OFFICE
CERTIFICATE OF CORRECTION

PATENT NO. : 5,517,039
DATED : May 14, 1996
INVENTOR(S) : Holonyak, Jr. et al.

It is certified that error appears in the above-indentified patent and that said Letters Patent is hereby corrected as shown below:

Title Page, [73] Assignee: After "Hewlett-Packard Company, Palo Alto, Calif." insert --and The Board Of Trustees Of The University Of Illinois, Urbana, Illinois--

Signed and Sealed this

Twenty-fourth Day of June, 1997

Attest:

BRUCE LEHMAN

Attesting Officer  Commissioner of Patents and Trademarks